United States Patent [19]

Varga

[11] Patent Number: 4,980,610
[45] Date of Patent: Dec. 25, 1990

[54] PLASMA GENERATORS

[75] Inventor: Istvan K. Varga, Windsor Gardens, Australia

[73] Assignee: The Secretary, Department of Defence, Canberra, Australia

[21] Appl. No.: 232,263

[22] Filed: Aug. 15, 1988

[30] Foreign Application Priority Data

Aug. 13, 1987 [AU] Australia ................................ PI3733
Jan. 18, 1988 [AU] Australia ................................ PI6336

[51] Int. Cl.$^5$ ............................................. H01J 7/24
[52] U.S. Cl. ......................... 315/111.21; 315/111.01; 315/111.41; 313/231.31
[58] Field of Search ...................... 315/111.21, 111.41, 315/111.81, 111.91, 111.51, 111.61, 111.71, 111.31, 111.01; 118/715, 719; 313/231.31

[56] References Cited

U.S. PATENT DOCUMENTS 3,655,508  4/1972  Hirsch ..................................... 176/5
3,660,715  5/1972  Post ........................................ 315/111.51
4,479,075  10/1984  Elliott .............................. 315/111.21
4,739,170  4/1988  Varga ................................... 250/427

OTHER PUBLICATIONS

I. K. Varga, "Multipurpose Plasma Generator Suitable for Diamondlike Carbon Film Formation", J. Vac. Sci., Technol. A.7 (4), Jul./Aug. 1989, pp. 2639–2645.

Primary Examiner—Eugene R. LaRoche
Assistant Examiner—Ali Neyzari
Attorney, Agent, or Firm—Cushman, Darby & Cushman

[57] ABSTRACT

A plasma generator utilizing two magnetrons preferably acting out of phase with each other and each comprising one part of the other magnetic mirror. There may be included a thermal fragmenter to produce gas atoms directly into the plasma for ionization before being drawn onto a substrate. The use of a thermal fragmenter separate from the magnetrons produces ionized atoms directly where they are needed and allows quicker changeover to alternative atoms for multilayer coating.

14 Claims, 3 Drawing Sheets

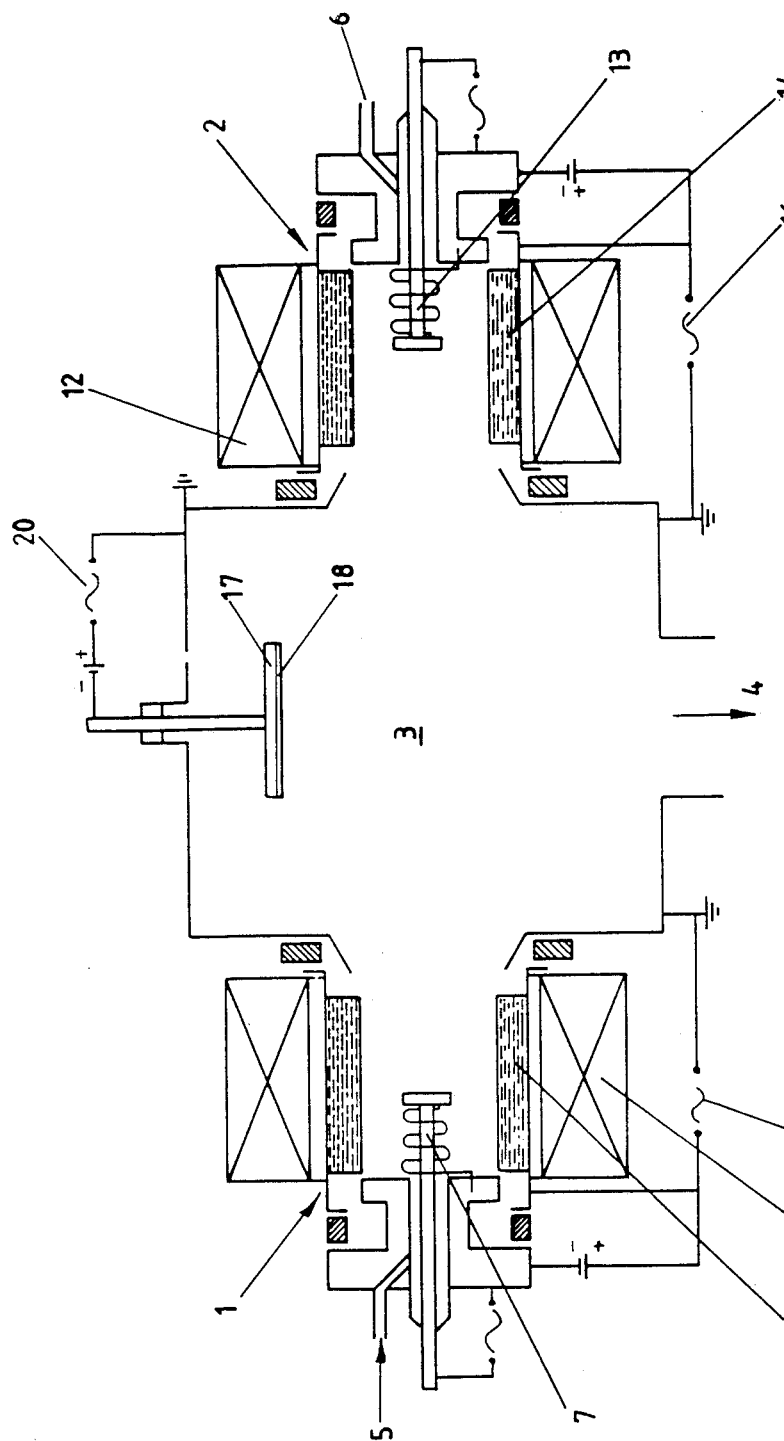

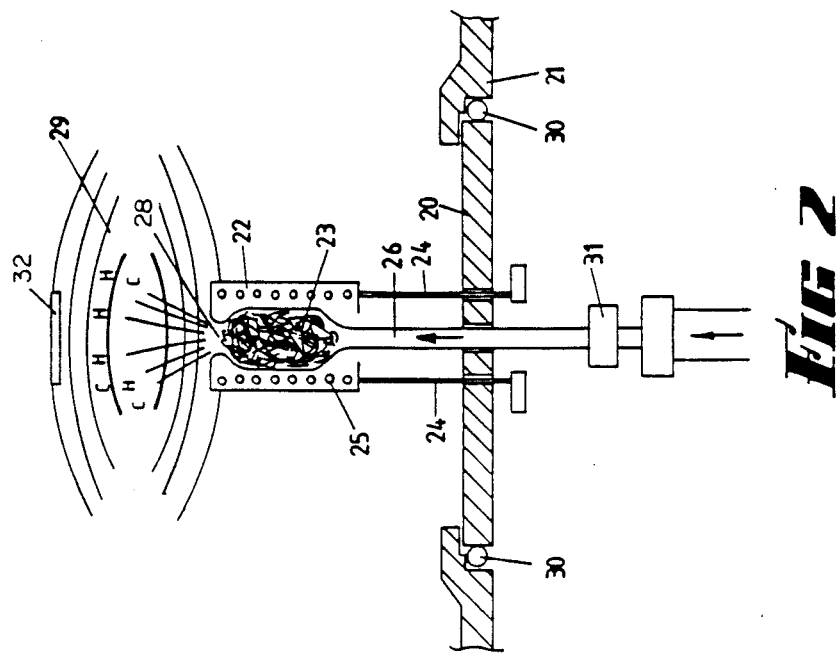
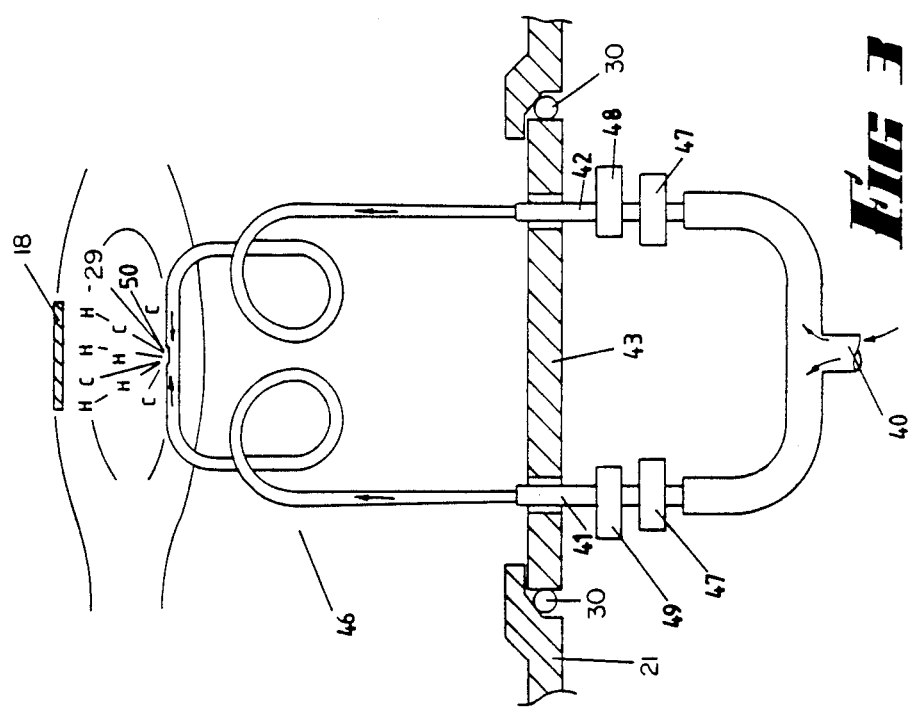

PLASMA GENERATORS

BACKGROUND OF THE INVENTION

1. Field of the Invention

This invention relates to techniques which may be used to expand and intensify plasma formed in a working chamber for deposition of ions and atoms onto substrates and for other purposes.

2. Description of the Related Art

In the last two decades, but particularly in recent years, significant developments have taken place in the area of plasma generation.

These have been prompted by the usefulness of plasma in all aspects of semi-conductor technology and by an ever increasing number of new applications.

Some of the areas where plasma, or its separated charged particles are used, are as ion sources, in ion rockets, in nuclear physics, in heavy-ion science, in ion plating, in crystal growth also known as ion beam epitaxy, synthesis of compound materials also known as plasma polymerization, in reactive sputtering, in ion sputtered activated reactive evaporation, in surface analysis in medical applications, in surface treatment in ion-assisted thin film deposition and in lasers and in many other applications.

As an example of the art, reference may be had to the proceedings of the International Engineering Congress, ISIAT'83 and IPAT'83 Kyoto (1983) in which a plasma system is described which was used for plasma oxidation of silicon surfaces as used in VLSI production, but the present invention has many applications besides these.

Also reference may be had to the specification of U.S. Pat. No. 3,660,715 in the name of Richard F. Post assigned to the United States Energy Commission which relates to plasma generator using a stack of pulsed washers to release ionize and heat the gas. The present invention relates to improvements in plasma generators as described in our earlier patent application No. PCT/AU86/00128.

SUMMARY OF THE INVENTION

The present invention generally consists of a plasma generator which allows both electrons and ions to oscillate in an applied filed at low frequency excitation with electrons and ions moving in opposite directions, but with two sources of ions and electrons to provide increased and more efficient deposition rates.

The invention also proposes improvements in plasma generators, particularly in the fragmentation and ionization of gas molecules introduced into such generators for some of the purposes discussed above.

In our earlier patent application, we discussed introduction of gases for ionization in the plasma generation region of the plasma generator but this invention also includes the proposal to introduce alternative methods of gas fragmentation to introduce fragmented gas particles into the plasma.

In one form, therefore, the invention is said to reside in a plasma generator which allows both electrons and ions to oscillate in an applied field at low frequency excitation with electrons and ions moving in opposite directions characterised by two sources of ions and electrons to provide an increased and more efficient plasma.

Such a plasma generator may include a thermal fragmenter.

Alternatively, the invention may be said to reside in a plasma generator having two sources of ions and electrons consisting of two plain cylindrical magnetrons at opposite ends of a plasma chamber, all three of which are pumped through by a high vacuum pumping system, the magnetrons each having means to produce electrons and including magnetic means to cause the electrons to rotate and spiral and ionize gas atoms or molecules introduced to the magnetrons to produce a plasma region in the chamber and means to establish an axial oscillation of electrons and ions in opposite directions, the chamber including an electrode adjacent to the plasma region which is polarized to produce either an electrically neutral or positive or negative stream of charged particles.

Preferably, the means to produce axial oscillation of electrons and ions comprises magnetic mirror means, the outlet of each of the magnetrons adjacent to the chamber whereby to increase significantly ion, electron interaction to facilitate multiple ionization and additionally to enhance neutral particle ionization.

Alternatively, the means to produce axial oscillation of the ions and electrons in the chamber may include an alternating potential difference between each magnetron and the chamber, the alternating potential difference being out of phase by 180° between the two magnetrons so that the ions from one magnetron and electrons from the other magnetron may be the same volume space within the chamber at the same time and vice versa.

Each of the magnetrons of this invention may have means to cause the electrons to rotate comprising a cylindrical anode and an axial magnet thereby forming a confined plasma.

The plasma generator of this form of the invention may further include a thermal fragmenter to assist in the fragmentation of gas molecules introduced into the chamber.

The thermal fragmenter may be placed into the chamber adjacent to, or extending into the plasma region formed within the chamber and the thermal fragmenter may be floated at the plasma potential.

In one preferred form, the thermal fragmenter may comprise a hollow heated filament of refractory material through which the gas to be ionized is passed with a vent hole int he filament in the region of the plasma region to allow the escape of fragmented molecules of the gas.

Such a filament may be made from a metal selected from tantalum, platinum, or other suitable material depending upon the type of gas which is to be fragmented and the proposed conditions in the chamber.

Alternatively, the thermal fragmenter may comprise an oven which includes a high surface area packing over which the gasses to be fragmented, are passed.

Such an oven may have electrical heating with an electrical filament around the oven.

The packing may be a fiber mesh of a metal selected from tantalum or platinum or may be a carbon fiber packing whereby the nature of the packing is selected for the type of gas to be fragmented.

Such a thermal fragmenter may be inserted into the plasma chamber in one wall of the plasma chamber and its junction with the wall of the chamber may be cooled and also the electrical elements extending into the thermal fragmenter may also be cooled.

By means of this present invention, considerably benefits can be obtained. The second magnetron can be identical in all respects to the first magnetron and they may each use the main magnet of the other as an opposite end of a magnetic mirror system which enables confinement of the plasma within the plasma chamber.

The temperature to which the thermal fragmenter may be raised will depend upon the type of gas to be fragmented and the materials of the fragmenter which may act as a catalyst for the fragmentation. For instance, in the coating of silicon onto a substrate, a gas which may be used in silane ($SiH_4$) which requires a temperature of about 300° C. or greater. Alternatively, if the gas to be fragmented is methane, so as to give a carbon deposition, a temperature of between 850° C. or greater is required.

For the process of the present invention, carrier gas is introduced into the magnation chamber to pass over the magnetron filament in the normal manner. For instance, a carrier gas such as argon, neon, nitrogen or other noble gas may be used. Once the carrier gas has ionized it will ion irradiate the substrate in the plasma chamber to assist in keeping the surface of the substrate clean and assist in film formation by neutral or ionized molecules or atoms.

The plasma chamber of the present invention including a thermal fragmenter may be used for any particular purpose for which ionized energetic atoms or gas molecules are required to be deposited onto a substrate to form films of desired characteristics. An electric field between the thermal fragmenter and the substrate may be used to draw the ions onto the substrate.

One example of this is in the application of a hard durable diamond like carbon coating to a semi-conducting substrate. For this, the temperature of the thermal fragmenter is raised to about 850° C. and methane gas is passed into the thermal fragmenter to project atoms of carbon and hydrogen into the plasma which are then ionized mainly by collisions with electrons in the plasma and then by suitable charging of the substrate the required carbon ions may be drawn onto the substrate surface to form the hard durable diamond like coating.

The thermal fragmenter of the various embodiments of the present invention, may be designed such that in affect, a jet of atoms of the fragmented gas is projected from it into the plasma where they are ionized before being drawn onto the substrate and, if necessary, by suitable movement of the thermal fragmenter or the substrate, various type and layers of coatings may be provided onto the substrate. There may, for instance, be several thermal fragmenters in a plasma chamber each adapted in turn to provide a particular coating onto the substrate with each fragmenter being moved into the required position as desired or the substrate being moved to be positioned adjacent to each fragmenter as desired.

Benefit may be obtained from the thermal fragmenter incorporated in the present invention if the atoms of the thermally fragmented gas molecules are ionized as they leave the fragmenter. This can be achieved if instead of a D.C. electrical power, an R.F. or combination of D.C. and R.F. power is used to heat a suitably structured fragmenter. The frequency and power input of the R.F. component is adjusted to give optimum ionization of atoms as the atoms are emerging through the aperture or apertures from the hollowed filament of the fragmenter.

This then generally describes the present invention, but to assist with understanding of the invention, reference will now be made to the accompanying drawings which show preferred embodiments of the invention and in which the drawings are schematic diagrammatic views of plasma generators.

BRIEF DESCRIPTION OF THE DRAWING

In the drawings

FIG. 1 is a plasma generator incorporating two magnetrons,

FIG. 2 is a one form of thermal fragmenter suitable for the present invention,

FIG. 3 shows a second form of thermal fragmenter suitable for the present invention.

DETAILED DESCRIPTION OF THE PRESENTLY PREFERRED EXEMPLARY EMBODIMENT

Figure 4:
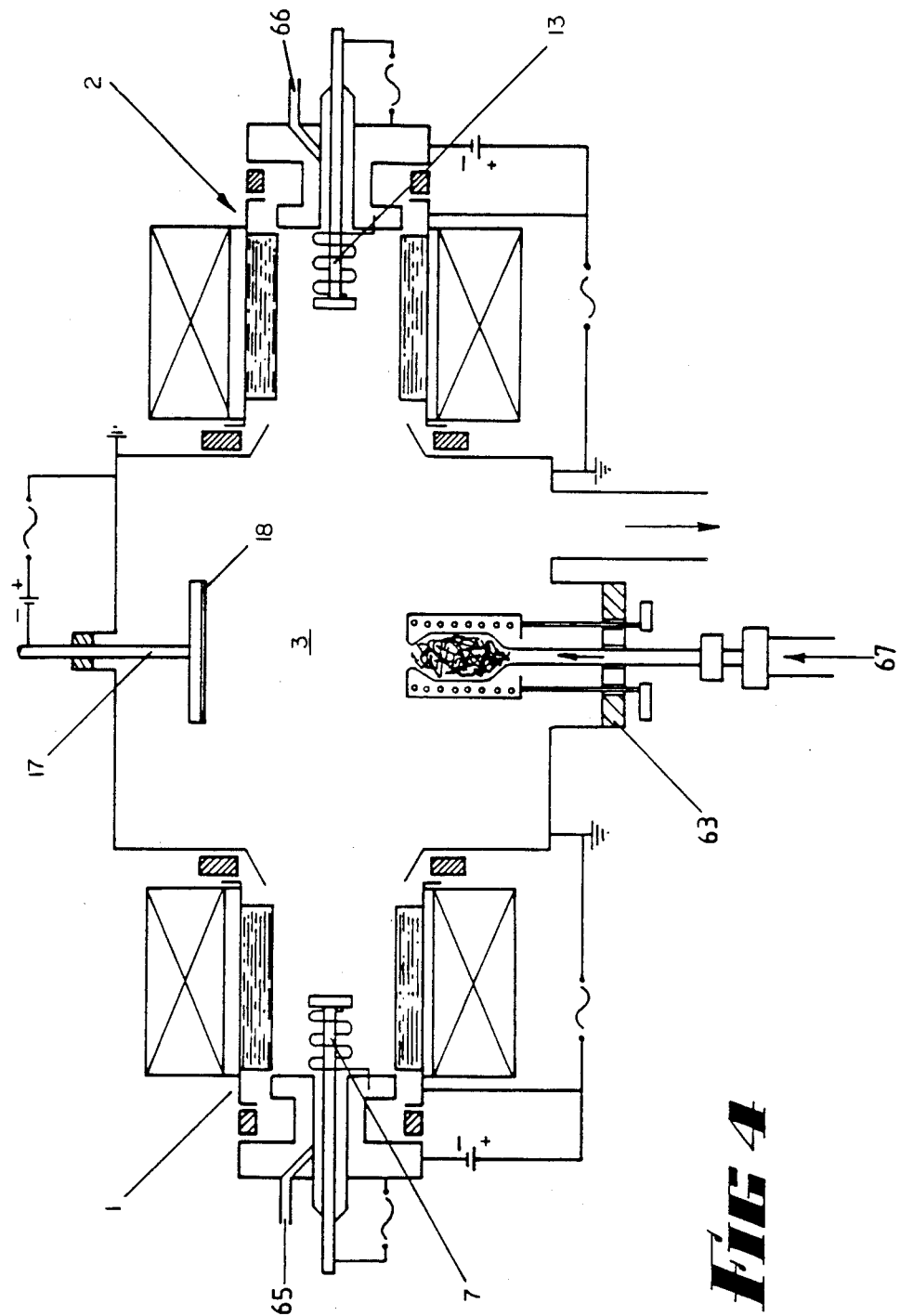
FIG. 4 shows a plasma chamber including a thermal fragmenter.

Now looking closely at the drawings and in particular FIG. 1, it will be seen that the main components of the plasma generator are a first magnetron 1, a second magnetron 2 and an evacuated plasma chamber 3. The magnetrons 1 and 2 are arranged on either side of the plasma chamber 3 and diametrically opposed to each other on a line which may be referred to as a magnetron axis. An opening 4 to the plasma chamber 3 extends to an evacuation apparatus (not shown).

Now looking particularly at the magnetron 1, the initial ionization takes place in the magnetron 1 which has an electron source 7 provided by a heated tungsten or tantalum or other filament placed at or near the magnetron axis. A cylindrical anode 8 and an axial magnet 11 form a magnetic field such that electrons emitted from the filament 7 are confined radially and prevented by the magnetic field from reaching the anode 8. The presence of the electric field and magnetic field causes the electrons emitted to rotate and spiral and as these become more energetic they ionize gas atoms of molecules introduced to the inlet 5 to form a confined plasma which may persist as long as suitable conditions are maintained.

According to this invention, the intensity of the plasma is increased by establishing an axial oscillation of electrons and ions. This may be achieved if consideration is given to the rate at which ions may respond to axial forces. Generally, with respect to electrons in a plasma, ions are considered stationary or of low mobility due to the very much larger mass compared to electrons. However, it has been found that if a suitable low frequency potential is applied along the magnetron axis, both electrons and positive ions may be made to oscillate axially. Negative ions, which are the result of electron attachment, may also move in opposite directions to the movement of the positive ions so that these are also subjected to collision with other particles. Ions achieve no nett movement if a high frequency potential is applied.

The nature of this mass transport is such that the particles with opposite charge polarity will move in opposite directions under the influence of the applied potential and this transportation mode will increase significantly the probability of ion-electron and ion-ion interaction, facilitating ionized molecule fracture and multiple ionization in addition to the enhancement of the neutral particle ionization.

The frequency used may depend on the nature of the ions but with gas ions produced by admitting Hydrogen, Argon, Nitrogen, Methane or other similar gases or vapors to the magnetron, it has been found that a frequency of oscillation of 50 Hz is effective, but that frequency can be selected over a wide range. Beyond 1 MHz, however, ions can be considered to be unaffected by the applied filed.

Now still looking only at one magnetron to facilitate the energy transfer described above, the magnetron chamber 1 and vacuum 3 combination is used such that at a low frequency alternating voltage is applied between the magnetron 1 and the vacuum 3 as indicated by symbol 9. To contain the plasma and to enhance further process of ionization, a magnetic filed in the form of a magnetic mirror is formed by the filed of electromagnet 11 and electromagnet 12. The electromagnet 12 is, however, the electromagnet of a second magnetron 2 which in a similar manner to magnetron 1 has a filament 13 producing electrons which are confined by means of cylindrical anode 14 and electromagnet 12 and by which electrons are caused to spin and to ionize molecules of gas to produce a further plasma which may then, in a similar manner to the first magnetron, enter the main plasma chamber 3.

Once the plasma is formed, the electromagnets 11 and 12, as discussed above, act as a magnetic mirror and maintain the plasma within the chamber 3.

While the magnetic mirror has little or no effect on the ions, it strongly influences electrons under static conditions. However, when the axial potential variation is applied above a certain voltage value, electrons are removed in an axial direction with sufficient energy to ionize additional gas particles. They will move alteratively between the magnetron 1 and the vacuum chamber 3 and the magnetron 2, as driven by the low frequency voltage gradient 9 and the corresponding voltage gradient on the other magnetron 2, shown by 16. Similarly, the positive ions are made to move by the same potential variation in the opposite direction to that of the electrons or negative ions.

As was mentioned earlier, the result of interaction with the charged particles with each other or with neutral atom or molecules generates more ionized particles which will also be influenced by the low frequency axial potential.

The low frequency potentials 9 and 16 may be utilized 180° out of phase so that electrons are available at all times and surface charging of a substrate 18 on an electrode 17 within the plasma chamber can be reduced or eliminated with an appropriate biased potential.

The electrode 17 supporting the substrate 18 may be positioned so that ion deposition from the plasma may occur, provided a suitable biased potential is provided to electrode 17 under suitable conditions. The bias of the off-axis substrate 18 may also be amended or include the possibility of using pulsed voltage 20 of square or sinusoidal wave form or other form of suitable period and mark to space ratio to optimize the control over the surface charging affects.

As we have discussed earlier, the production of a plasma within the plasma chamber may be enhanced by introducing a gas to be ionized directly into the plasma chamber 3 rather than into the ionizing gas inlets 5 and 6. If the gas to be ionized such as methane is not allowed to enter through the gas inlets 5 and 6, then poisoning of the electrodes 7 and 13 will be reduced or not occur. Hence, it is necessary to provide some form of device to introduce gas molecules or fragmented gas molecules into the for instance, argon, plasma. This may be done by use of the thermal fragment as shown in FIGS. 2 and 3.

In the thermal fragmenter shown in FIG. 2, a flange 20 fitted into the wall 21 of the plasma chamber may support an oven 22. Inside the oven 22 is a fine tantalum wire wool or other suitable high surface area material 23 which is heated by means of electrical wires 24 which extend through the flange 20. The electrical wire 24 extend into a heating element 25 and the walls of the oven 22.

It will be realised, however, that other forms of heating for the oven may also be used.

A gas inlet 26 is provided into the oven so that gas to be fragmented may be introduced into the oven before being ejected out of the relatively narrow opening 28 into the plasma region shown by 29. The shape and positioning of the relatively narrow opening 28, opening into the plasma from the oven may be used to direct gas atoms into the plasma in such a way that they can be directed into the required patterns or arrangements onto the substrate 32. The flange 20 may include cooling coils 30 to cool the flange and a cooling jacket 31 to cool the gas inlet.

FIG. 3 shows an alterative form of thermal fragmenter in which gas is allowed into an inlet 40 to pass into arms 41 and 42, which extend through a flange 43 in the wall 21 of a plasma chamber to direct gas into a heating filament generally shown by 46. The arms 41 and 42 are cooled by means of cooling jackets 47 and are insulated from each other so that an electrical current may be passed in through the electrodes 48 and 49 so that the filament 46 acts as a heated filament. Hence, gas which is passed in through the opening 40, is heated as it passes into the filament and is thermally cracked before exiting through aperture 50 in the plasma region 29.

In this particular embodiment, the gas entering is methane and hence, disassociated atoms of carbon and hydrogen are ejected through the aperture 50 and, by use of suitable potentials, may be deposited onto the substrate 18.

Once again, cooling coils 30 may be provided in the flange 43.

FIG. 4 shows an arrangement of plasma generator which has a first magnetron 1 and a second magnetron 2 with a plasma chamber 3 between the two magnetrons and with a thermal fragmenter generally shown as 63 extending into the plasma chamber and also a substrate holding electrode 17 extending into the plasma chamber.

In this embodiment, the magnetrons 1 and 2 act in exactly the same manner as the magnetrons 1 and 2 as shown in FIG. 1, but the gas which enters through the inlet 65 for magnetron 1 and 66 for magnetron 2 is only the carrier gas such as argon and not the gas to be ionized such as methane or silane. The methane or silane is introduced through gas aperture 67 into thermal fragmenter 63 which is of the type as discussed in FIG. 2.

By this means, the filaments 7 and 13 of the magnetron 1 and 2 respectively have less tendency to become poisoned by the introduction of the gas to be ionized adjacent them and hence, more efficient plasma generation occurs.

As discussed earlier, there may be a number of thermal fragmenters 63 mounted, for instance, on a turntable within the plasma generator so that any one of the thermal fragmenters may be selected so that at various times during the deposition process, for instance, onto a substrate 18 on the electrode 18 different atoms of gas molecules may be deposited onto the substrate 18 by means of selection of different thermal fragmenters.

It will be seen that by this invention, there is provided an arrangement where, owing to the fact that two magnetrons are each producing plasmas of ions and electrons and, preferably, when operated 180° out of phase, there will be ions and electrons available at the substrate surface if ion deposition is being carried out or on any other form of target or application which the plasma generator, of the present invention, may be applied and, as such, much more efficient use of the plasma is obtained.

In particular, with use of a substrate as discussed above, the present invention may increase deposition rates while maintaining quality of adhesion, hardness and thickness consistency on diamond like carbon films and, further, it can reduce the time taken to process a hard carbon coating by 50% or more.

I claim:

1. A plasma generator which allows both electrons and ions to oscillate in an applied filed at low frequency excitation with electrons and ions moving in opposite directions, said generator comprising:
   two sources of ions and electrons disposed at opposite internal sides of a plasma chamber so as to provide an increased and more efficient plasma; and
   an electrode in the plasma chamber which is polarized to one of extract and utilize at least one of electrically neutral, positive and negative charged particles generated in said plasma chamber.

2. A plasma generator as in claim 1 further including at least one thermal fragmenter.

3. A plasma generator having a plasma chamber and two sources of ions and electrons comprising two plain cylindrical magnetrons at opposite ends of the plasma chamber, the chamber and the two magnetrons being pumped through by a high vacuum pumping system, the magnetrons each having means for producing electrons and including magnetic means to cause the electrons to rotate and spiral and ionize gas atoms or molecules introduced to the magnetrons to produce a plasma region in the chamber and means to establish an axial oscillation of electrons and ions in opposite directions, the chamber including an electrode adjacent to the plasma region which is polarized to one of extract and utilize at least one of electrically neutral, position and negative charged particles generated in the plasma chamber.

4. A plasma generator as in claim 3 wherein the means to produce axial oscillation of electrons and ions comprises magnetic mirror means at the outlet of each of the magnetrons adjacent to the chamber whereby to increase significantly ion electron interaction to facilitate multiple ionization and additionally to enhance neutral particle ionization.

5. A plasma generator as in claim 3, wherein the means to produce axial oscillation of the ions and electrons in the chamber includes an alternating potential deference between each magnetron and the chamber, the alternating potential difference being out of phase by 180° between the two magnetrons so that ions from one magnetron and electrons from the other magnetron may be in the same volume space within the chamber at the same time and vice versa.

6. A plasma generator as in claim 3 wherein the means to cause the electrons to rotate in each of the magnetrons is a cylindrical anode and an axial magnet thereby forming a confined plasma.

7. A plasma generator as in claim 3 further including a thermal fragmenter to assist in the fragmentation of gas molecules introduced into the chamber.

8. A plasma generator as in claim 7 wherein the thermal fragmentor is placed in the chamber adjacent or extending into the plasma region.

9. A plasma generator as in claim 8 wherein the thermal fragmenter extends into the plasma region and is floated at the plasma potential.

10. A plasma generator as in claim 7 wherein the thermal fragmenter is a hollow heated filament of refractory metal through which the gas to be ionized is passed with a vent hole in the filament in the region of the plasma region to allow the escape of the fragmented molecules of the gas.

11. A plasma generator as in claim 10 wherein the filament is made from a metal selected from tantalum, platinum or other suitable material depending upon the type of gas which is to be fragmented and the proposed conditions in the chamber.

12. A plasma generator as in claim 7 wherein the thermal fragmenter comprises an oven, which includes a high surface area packing over which the gas to be fragmented is passed.

13. A plasma generator as in claim 12, wherein the oven has electrical heating with an electrical filament around the oven.

14. A plasma generator as in claim 11 wherein the packing is a fibre mesh of a metal selected from tantalum or platinum or is a carbon fibre packing whereby the nature of the packing is selected for the type of gas to be fragmented.

* * * * *